United States Patent
Xu (10) Patent No.: US 9,640,439 B2
(45) Date of Patent: May 2, 2017

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventor: Jianhua Xu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/690,044

(22) Filed: Apr. 17, 2015

(65) Prior Publication Data
US 2016/0013289 A1    Jan. 14, 2016

(30) Foreign Application Priority Data
Jul. 9, 2014   (CN) .......................... 2014 1 0325958

(51) Int. Cl.
*H01L 21/8234* (2006.01)
*H01L 21/8238* (2006.01)
(Continued)

(52) U.S. Cl.
CPC .. *H01L 21/82345* (2013.01); *H01L 21/02532* (2013.01); *H01L 21/02592* (2013.01);
(Continued)

(58) Field of Classification Search
CPC ....... H01L 21/82345; H01L 21/823842; H01L 29/66545
See application file for complete search history.

(56) References Cited

U.S. PATENT DOCUMENTS

| 5,151,255 A * | 9/1992 | Fukuda | .................. H01L 31/202 |
| | | | 136/258 |
| 2010/0301427 A1* | 12/2010 | Lenski | .............. H01L 21/28088 |
| | | | 257/392 |

(Continued)

OTHER PUBLICATIONS

Choon-Hwan Kim, et al., Improvement of Adhesion Performances of CVD-W Films Deposited on B2H6-Based ALD-W Nucleation Layer, Electrochemical and Solid-State Letters 12 (3), pp. H80-H83, (2009).

*Primary Examiner* — Phat X Cao
(74) *Attorney, Agent, or Firm* — Innovation Counsel LLP (57) ABSTRACT

A method for manufacturing a semiconductor device may include the following steps: providing a semiconductor substrate structure; providing a substrate-connecting barrier layer on the semiconductor substrate structure; performing one or more iterations of a composite-layer formation process to provide a gate-connecting barrier layer, wherein the composite-layer formation process comprises: applying a silicon-containing compound set to an outmost existing barrier layer to form an amorphous silicon layer, and forming an overlying barrier layer on the amorphous silicon layer, wherein the substrate-connecting barrier layer is the outmost existing barrier layer for a first iteration of the one or more iterations, and wherein the gate-connecting barrier layer is the overlying barrier layer resulted from a last iteration of the one or more iterations; and providing a conductive gate layer on the gate-connecting barrier layer.

15 Claims, 4 Drawing Sheets

(51) Int. Cl.
  *H01L 29/66* (2006.01)
  *H01L 21/02* (2006.01)
  *H01L 21/28* (2006.01)
  *H01L 21/285* (2006.01)
  *H01L 21/768* (2006.01)
  *H01L 29/49* (2006.01)
  *H01L 21/66* (2006.01)

(52) U.S. Cl.
  CPC .. *H01L 21/28088* (2013.01); *H01L 21/28568* (2013.01); *H01L 21/76841* (2013.01); *H01L 21/823456* (2013.01); *H01L 21/823842* (2013.01); *H01L 29/4966* (2013.01); *H01L 29/66545* (2013.01); *H01L 21/76846* (2013.01); *H01L 22/12* (2013.01); *H01L 22/20* (2013.01)

(56) References Cited

U.S. PATENT DOCUMENTS

| | | | |
|---|---|---|---|
| 2012/0038009 A1* | 2/2012 | Toh | H01L 21/28079 257/411 |
| 2013/0020656 A1* | 1/2013 | Jakubowski | H01L 21/28088 257/410 |
| 2013/0105908 A1* | 5/2013 | Saino | H01L 27/10891 257/369 |
| 2014/0231922 A1* | 8/2014 | Kim | H01L 29/401 257/369 |
| 2015/0061042 A1* | 3/2015 | Cheng | H01L 29/4966 257/412 |

* cited by examiner

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201410325958.8, filed on 9 Jul. 2014; the Chinese Patent Application is incorporated herein by reference in its entirety.

BACKGROUND OF THE INVENTION

The present invention is related to a semiconductor device, a method for manufacturing the semiconductor device, and an electronic device that includes the semiconductor device.

A semiconductor device may include a gate structure disposed on a semiconductor substrate structure. The gate structure may include a metal gate disposed on a barrier layer. The barrier may be positioned between the metal gate and the semiconductor substrate structure for preventing metal contamination in the semiconductor substrate structure. Defects at the interface between the metal gate and the barrier layer may cause the metal gate structure to separate from the barrier layer. Additionally or alternatively, defects at the interface between the barrier layer and the semiconductor substrate may cause the gate structure to separate from the semiconductor substrate structure. As a result, the performance of the semiconductor device may be unsatisfactory.

SUMMARY

An embodiment of the present invention may be related to a method for manufacturing a semiconductor device. The method may include the following steps: providing a semiconductor substrate structure; providing a substrate-connecting barrier layer on the semiconductor substrate structure; performing one or more iterations of a composite-layer formation process to provide a gate-connecting barrier layer; and providing a conductive gate layer on the gate-connecting barrier layer.

The composite-layer formation process may include the following steps: applying a silicon-containing compound set to an outmost existing barrier layer to form an amorphous silicon layer; and forming an overlying barrier layer on the amorphous silicon layer. The substrate-connecting barrier layer may be the outmost existing barrier layer for the first iteration of the one or more iterations. The gate-connecting barrier layer may be the overlying barrier layer resulted from the last iteration of the one or more iterations A material of the substrate-connecting barrier layer may be same as a material of the gate-connecting barrier layer.

The silicon-containing compound set may include a silicon hydride.

The silicon-containing compound set may include silane.

The composite-layer formation process may be performed only once to obtain the gate-connecting barrier layer. Alternatively, at least two iterations of the composite-layer formation process may be performed to obtain the gate-connecting barrier layer.

The method may include the following step: determining a number of the iterations based on a predetermined target height of the gate-connecting barrier layer.

The method may include the following steps: monitoring a height of the overlying barrier layer; and designating the overlying barrier layer as the gate-connecting barrier layer if the height of the overlying layer reaches a predetermined value.

A thickness of the substrate-connecting barrier layer may be greater than or equal to a half (½) of a target height of the gate-connecting barrier layer with respect to the semiconductor substrate structure.

The silicon-containing compound set may be applied to the outmost existing barrier layer for a time length in a range of 5 seconds to 60 seconds for each of the one or more iterations.

A thickness of the substrate-connecting barrier layer in a direction may be unequal to a thickness of the gate-connecting barrier layer in the direction.

A first silicon-containing compound set may be applied to the substrate-connecting barrier layer to form a first amorphous silicon layer. A first overlying barrier layer may be formed on the first amorphous silicon layer. A second silicon-containing compound set may be applied to the first overlying barrier layer to form a second amorphous silicon layer. The second amorphous silicon layer may be positioned between the first amorphous silicon layer and the gate-connecting barrier layer after the gate-connecting barrier layer has been formed.

A thickness of the substrate-connecting barrier layer in a direction may be unequal to a thickness of the first overlying barrier layer in the direction.

A thickness of the first overlying barrier layer in a direction may be unequal to a thickness of the gate-connecting barrier layer in the direction.

A first silicon-containing compound set may be applied to the substrate-connecting barrier layer for a first time length to form a first amorphous silicon layer. A first overlying barrier layer may be formed on the first amorphous silicon layer. A second silicon-containing compound set may be applied to the first overlying barrier layer for a second time length to form a second amorphous silicon layer. The second time length may be unequal to the first time length.

A first silicon-containing compound set may be applied to the substrate-connecting barrier layer to form a first amorphous silicon layer. A first overlying barrier layer may be formed on the first amorphous silicon layer. A second silicon-containing compound set may be applied to the first overlying barrier layer to form a second amorphous silicon layer. The first silicon-containing compound set may include a first silicon-containing compound. The second silicon-containing compound set may include a second silicon-containing compound. A molecular formula of the second silicon-containing compound may be different from a molecular formula of the first silicon-containing compound.

An embodiment of the present invention may be related to a semiconductor device. The semiconductor device may include the following elements: a semiconductor substrate structure; a conductive gate layer that overlaps the semiconductor substrate structure; a substrate-connecting barrier layer positioned between the semiconductor substrate structure and the conductive gate layer; a gate-connecting barrier layer positioned between the substrate-connecting barrier layer and the conductive gate layer; and a first amorphous silicon layer positioned between the substrate-connecting barrier layer and the gate-connecting barrier layer.

A material of the substrate-connecting barrier layer may be same as a material of the gate-connecting barrier layer.

The semiconductor device may further include the following elements: an intermediate barrier layer positioned between the first amorphous silicon layer and the gate-connecting barrier layer; and a second amorphous silicon layer positioned between the intermediate barrier layer and the gate-connecting barrier layer.

An embodiment of the present invention may be related to an electronic device. The electronic device may include an electronic component and may include a semiconductor device that is electronically connected to the electronic component. The semiconductor device may include the following elements: a semiconductor substrate structure; a conductive gate layer that overlaps the semiconductor substrate structure; a substrate-connecting barrier layer positioned between the semiconductor substrate structure and the conductive gate layer; a gate-connecting barrier layer positioned between the substrate-connecting barrier layer and the conductive gate layer; and a first amorphous silicon layer positioned between the substrate-connecting barrier layer and the gate-connecting barrier layer.

According to embodiments of the invention, in semiconductor devices, amorphous layers may limit sizes of columnar crystallites of barrier layers, such that density (or denseness) of the barrier layers may be enhanced. Therefore, penetration or diffusion of unwanted particles (e.g., boron particles) may be substantially blocked, and interface defects may be minimized or substantially prevented. Advantageously, satisfactory quality of the semiconductor devices may be ensured, and a satisfactory manufacturing yield may be achieved.

Embodiments of the invention may enable effective control of the thickness of a composite barrier layer that is positioned between a semiconductor substrate structure and a conductive gate layer. Advantageously, design specifications may be satisfied.

The above summary is related to some of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
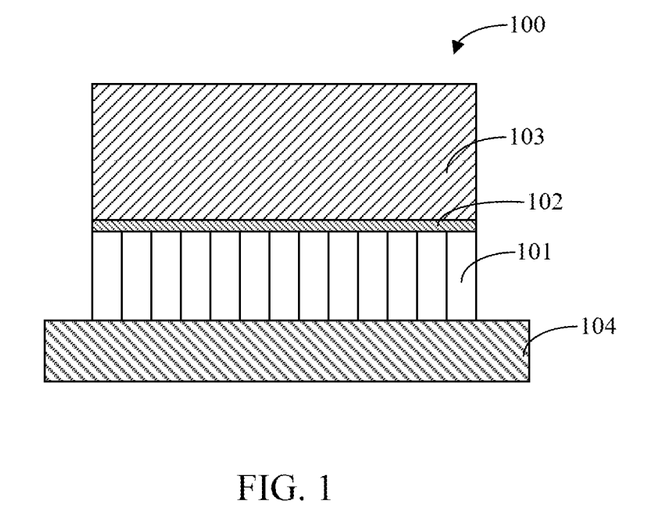
FIG. 1 shows a schematic diagram (e.g., a schematic cross-sectional view) that illustrates elements and/or structures of a semiconductor device in accordance with one or more embodiments of the present invention.

FIG. 1 shows a schematic diagram (e.g., a schematic cross-sectional view) that illustrates elements and/or structures of a semiconductor device 100 in accordance with one or more embodiments of the present invention. The semiconductor device 100 may include a semiconductor substrate structure 104, a barrier layer 101 positioned on the semiconductor substrate structure 104, an intermediate layer 102 positioned on the barrier layer 101, and a metal gate 103 positioned on the intermediate layer 102. The barrier layer 101 may be formed of titanium nitride (TiN). The intermediate layer 102 may be formed of tungsten nitride (WN). The metal gate may be formed of tungsten (W).

The intermediate layer 102 may be formed on the barrier layer 101; subsequently, the metal gate 103 may be formed on the intermediate layer 102 through a deposition process. The intermediate layer 102, which is positioned between the barrier layer 101 and the metal gate 103, may minimize interface defects. As a result, satisfactory performance of the semiconductor device 100 may be attained.

Figure 2:
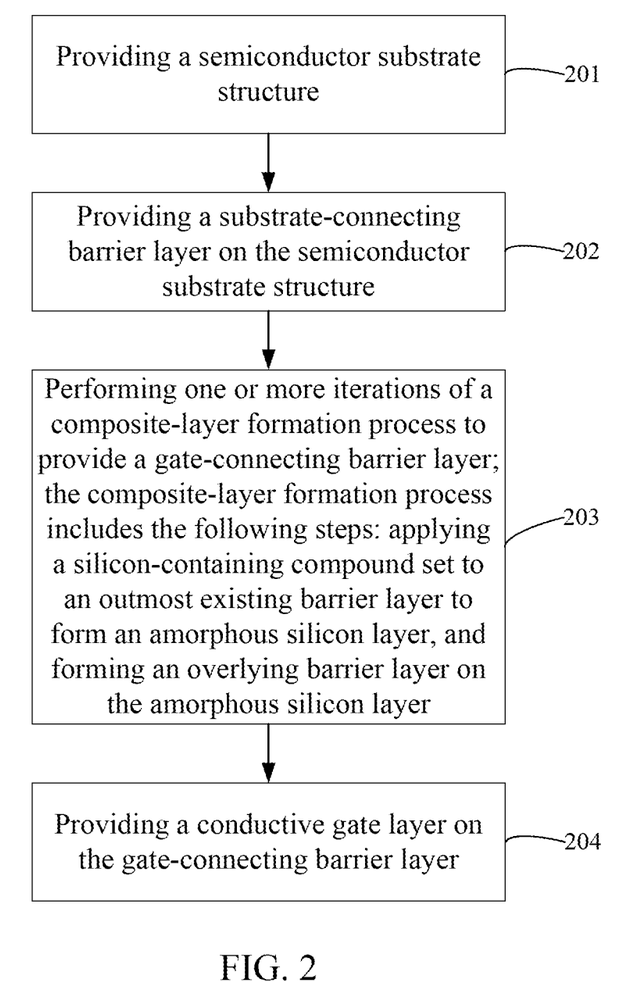
FIG. 2 shows a flowchart that illustrates steps in a method for manufacturing a semiconductor device in accordance with one or more embodiments of the present invention.
Figure 3:
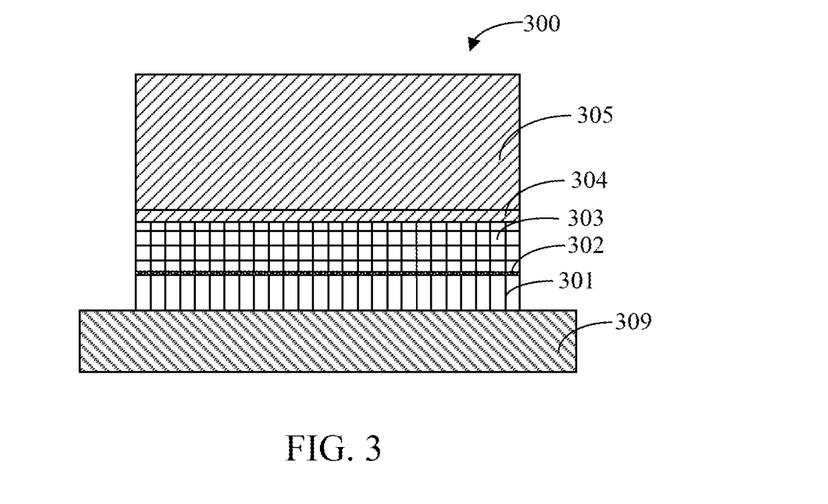
FIG. 3 shows a schematic diagram (e.g., a schematic cross-sectional view) that illustrates elements and/or structures of a semiconductor device in accordance with one or more embodiments of the present invention.
Figure 4:
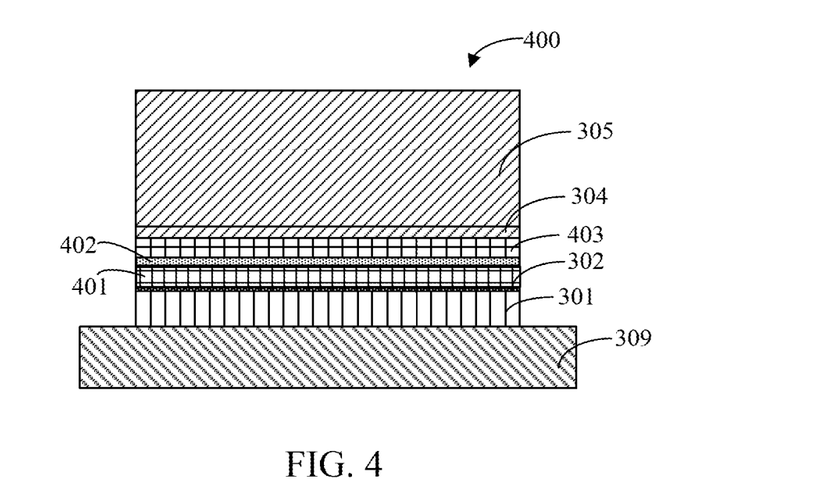
FIG. 4 shows a schematic diagram (e.g., a schematic cross-sectional view) that illustrates elements and/or structures of a semiconductor device in accordance with one or more embodiments of the present invention.

FIG. 2 shows a flowchart that illustrates steps in a method for manufacturing a semiconductor device, e.g., a semiconductor device 300 with elements illustrated in FIG. 3 or a semiconductor device 400 with elements illustrated in FIG. 4, in accordance with one or more embodiments of the present invention. FIG. 3 shows a schematic diagram (e.g., a schematic cross-sectional view) that illustrates elements and/or structures of the semiconductor device 300 in accordance with one or more embodiments of the present invention. FIG. 4 shows a schematic diagram (e.g., a schematic cross-sectional view) that illustrates elements and/or structures of the semiconductor device 400 in accordance with one or more embodiments of the present invention.

Referring to FIG. 2, FIG. 3, and FIG. 4, the method may include a step 201, providing a semiconductor substrate structure 309.

The semiconductor substrate structure 309 may include a semiconductor substrate. For example, the semiconductor substrate may be or may include at least one of a silicon substrate, a silicon-on-insulator (SOI) substrate, a strained-silicon-on-insulator (SSOI) substrate, a stacked-silicon-germanium-on-insulator (S—SiGeOI), a silicon-germanium-on-insulator (SiGeOI) substrate, and a germanium-on-insulator (GeOI) substrate. The semiconductor substrate may include at least one shallow trench isolation (STI) structure configured to isolate active regions. The STI structure may be formed of one or more low-k dielectric materials, such as one or more of silicon oxide, silicon nitride, silicon oxynitride, and fluorine-doped glass. The semiconductor substrate may include one or more doped wells. The semiconductor substrate may include one or more fin structures.

The semiconductor substrate structure 309 may include an interlayer dielectric layer, which may have an opening. A gate structure (e.g., a metal gate structure) may be formed at the opening. The gate structure may include a conductive gate layer (e.g., 304 and/or 305), barrier layers (e.g., 301, 303, 401, and/or 403), and one or more amorphous silicon layers (e.g., 302 and/or 402). The interlayer dielectric layer may include a doped silicon oxide layer or an undoped silicon oxide layer. For example, the interlayer dielectric layer may include an undoped silicate glass (USG), phosphosilicate glass (PSG), or borophosphosilicate glass (BPSG) layer. The interlayer dielectric layer may be formed through one or more of a thermal chemical vapor deposition (thermal CVD) process and a high density plasma (HDP) process.

The semiconductor substrate structure 309 may include a gate dielectric layer, which may be exposed by the opening of the interlayer dielectric layer. The gate dielectric layer may include a layer formed of a dielectric material that has a dielectric constant (measured in vacuum) in a range of about 4 to about 20. For example, the gate dielectric layer may include a layer formed of one or more of an oxide of silicon, a nitride of silicon, and an oxynitride of silicon. Alternatively or additionally, the gate dielectric layer may include a layer formed of a dielectric material (and electrolyte material) that has a dielectric constant in a range of about 20 to about 100. For example, the gate dielectric layer may include a layer formed of one or more of hafnium oxide, hafnium silicate, titanium oxide, barium strontium titanate (BST), and lead zirconate titanate (PZT). The gate dielectric layer may be formed through one or more of a thermal oxidation process, a plasma oxidation, a thermal nitriding process, a plasma nitriding process, a chemical vapor deposition (CVD) process, and a physical vapor deposition (PVD) process. The gate dielectric layer may include a thermal silicon oxide layer that has a thickness in a range of about 5 angstroms to about 70 angstroms. Before the formation of the gate dielectric layer, an interface layer may be formed.

The semiconductor substrate structure 309 may include a cap layer, which may be positioned at one or more sidewalls and/or a bottom of the interlayer dielectric layer and the opening. The cap layer may be formed of one or more of titanium nitride (TiN) and tantalum nitride (TaN).

The semiconductor substrate structure 309 may include a work function layer, which may be positioned on the cap layer. The work function layer may be formed of one or more suitable materials for enhancing performance of the semiconductor device. In an embodiment, the semiconductor device may be a P-type field effect transistor (PFET) device, and the work function layer may include a P-type work function metal layer. The P-type work function metal layer may be formed of one or more of titanium nitride ($Ti_xN_{1-x}$), tantalum carbide (TaC), molybdenum nitride (MoN), tantalum nitride (TaN), and other suitable materials; may be formed through one or more of one or more of a CVD process, a PVD process, and an atomic layer deposition (ALD) process; and may have a thickness in a range of 10 angstroms to 80 angstroms. In an embodiment, the semiconductor device may be an N-type field effect transistor (PFET) device, and the work function layer may include a N-type work function metal layer. The N-type work function metal layer may be formed of one or more of tantalum carbide (TaC), titanium (Ti), aluminum (Al), titanium aluminide ($Ti_xAl_{1-x}$), and other suitable materials; may be formed through one or more of one or more of a CVD process, a PVD process, and an atomic layer deposition (ALD) process; and may have a thickness in a range of 10 angstroms to 80 angstroms.

Referring to FIG. 2, FIG. 3, and FIG. 4, the method may further include a step 202 (subsequent to the step 201), providing a substrate-connecting barrier layer 301 on the semiconductor substrate structure 309. The substrate-connecting barrier layer 301 may be formed on (and directly connected to) the work function layer of the semiconductor substrate structure 309. The substrate-connecting barrier layer 301 may be formed of titanium nitride (TiN).

In an embodiment, a thickness of the substrate-connecting barrier layer 301 may be greater than or equal to a half of a target height of a gate-connecting barrier layer (e.g., 303 or 403) with respect to the semiconductor substrate structure 309 in a direction perpendicular to the bottom surface of the semiconductor substrate structure 309. In other words, the thickness of the substrate-connecting barrier layer 301 may be greater than or equal to a half of a target total thickness of the composite barrier layer to be formed, such as the composite barrier layer that includes the layers 301, 302, and 303 illustrated in FIG. 3 or the composite barrier layer that include layers 301, 302, 401, 402, and 403 illustrated in FIG. 4. The relatively large thickness of the base barrier 301 may reduce the number of iterations of a composite-layer formation process subsequently performed, such that the time required for manufacturing the semiconductor device may be reduced.

In an embodiment, a thickness of the substrate-connecting barrier layer 301 may be less than or equal to a half of a target height of a gate-connecting barrier layer (e.g., 303 or 403) with respect to the semiconductor substrate structure 309 in a direction perpendicular to the bottom surface of the semiconductor substrate structure 309. In other words, the thickness of the substrate-connecting barrier layer 301 may be less than or equal to a half of a target total thickness of the composite barrier layer to be formed. For example, the thickness of the substrate-connecting barrier layer 301 may ½ or ¼ of the target total thickness of the composite barrier layer. The relatively small thickness of the substrate-connecting barrier layer 301 may enable formation of more amorphous silicon layers (e.g., 302, 402, and/or analogous layers) to be formed in the composite barrier layer, such that characteristics of the composite barrier layer may be optimized and/or interface defects may be minimized.

The substrate-connecting barrier layer 301 may be formed through an atomic layer deposition (ALD) process. The semiconductor substrate structure 309 may be placed inside a reaction chamber. Subsequently, a titanium-containing precursor (e.g., a gas) and a nitrogen-containing precursor (e.g., a plasma or gas) may be intermittently and/or alternately provided into the reaction chamber. The titanium-containing precursor gas may include one or more of tetrakis (dimethylamino) titanium (TDMAT), tetrakis (diethylamino) titanium (TDEAT), tetrakis (ethylmethylamino) titanium (TEMAT), etc. The Nitrogen-containing precursor may include one or more of nitrogen (e.g., in the form of plasma, $N_2$, or atomic N), ammonia ($NH_3$), hydrazine ($N_2H_4$), a nitrogen plasma source (e.g., N, $N_2$, $NH_3$, or $N_2H_4$ plasma), etc.

In an embodiment, a deposition process performed for forming the substrate-connecting barrier layer 301 of TiN may include intermittently and/or alternately providing a tetrakis (diethylamino) titanium (TDEAT) gas and an ammonia gas into the reaction chamber. The deposition process may be performed at a temperature in a range of 200 degrees Celsius to 450 degrees Celsius.

Referring to FIG. 2, FIG. 3, and FIG. 4, the method may further include a step 203 (subsequent to the step 202), performing one or more iterations of a composite-layer formation process to provide a gate-connecting barrier layer, such as the barrier layer 303 illustrated in FIG. 3 or the barrier layer 403 illustrated in FIG. 4. The composite-layer formation process may include the following steps: applying a silicon-containing compound set to an outmost existing barrier layer (or topmost existing barrier layer) to form an amorphous silicon layer, and forming an overlying barrier layer on the amorphous silicon layer. The substrate-connecting barrier layer 301 may be the outmost existing barrier layer for the first iteration of the one or more iterations. The gate-connecting barrier layer (e.g., 303 or 403) may be the overlying barrier layer resulted from the last iteration of the one or more iterations. The gate-connecting barrier layer may be directly connected to a the subsequently formed conductive gate layer (e.g., 304 and/or 305).

In an embodiment, referring to FIG. 3, the number of the iterations may be equal to 1, the first iteration is the last iteration, and the composite-layer formation process may be performed only once to obtain the gate-connecting barrier layer 303. One amorphous silicon layer 302 may be provided in the resulted composite barrier layer (which includes layers 301, 302, and 303) to enable enhancement of composite barrier layer characteristics and minimization of interface defects without significantly increasing manufacturing time.

In an embodiment, referring to FIG. 4, the number of the iterations may be equal to 2, and the composite-layer formation process may be performed twice to obtain the gate-connecting barrier layer 403. Two amorphous silicon layers 302 and 402 may be provided in the resulted composite barrier layer (which includes layers 301, 302, 401, 402, and 403) to further enhance composite barrier layer characteristics and minimize interface defects.

More than 2 (e.g., 3, 4, or 5) iterations of the composite-layer formation process may be performed to further enhance composite barrier layer characteristics and minimize interface defects.

In an iteration of the composite-layer formation process, for forming an amorphous silicon layer (e.g., the amorphous silicon layer 302 illustrated in each of FIG. 3 and FIG. 4 for the first iteration or the amorphous silicon layer 402 illustrated in FIG. 4 for the second iteration), a structure that includes the semiconductor substrate structure 309 and the existing outmost barrier layer (e.g., the substrate-connecting barrier layer 301 illustrated in each of FIG. 3 and FIG. 4 for the first iteration or the barrier layer 401 illustrated in FIG. 4 for the second iteration) may be placed inside a/the reaction chamber. A silicon-containing compound set may be provided into the reaction chamber. When gas molecules of the silicon-containing compound set reach the exposed surface of the existing outmost barrier layer, the gas molecules may decompose to form the amorphous silicon layer on the surface of the existing outmost barrier layer (e.g., the substrate-connecting barrier layer 301 for the first iteration). The amorphous silicon layer may be substantially thin. In an embodiment, the amorphous silicon layer may be a monoatomic amorphous silicon layer.

A silicon-containing compound set used for an iteration may include a silicon hydride, which may have a molecular formula of $Si_nH_{2n+2}$. In an embodiment, the value of n may be in a range of 1 to 10. In an embodiment, the value of n may be greater than 10. In an embodiment, the silicon-containing compound set may include silane ($SiH_4$). In an embodiment, the existing outmost barrier layer may be exposed to, immersed in, and/or soaked the silicon-containing compound set for a time length of 5 seconds to 60 seconds (e.g., 10, 15, 20, or 30 seconds) for an iteration.

In an iteration of the composite-layer formation process, for forming the overlying barrier layer (e.g., the barrier layer 303 or 401 for the first iteration or the barrier layer 403 for the second iteration), after an amorphous silicon layer (e.g., the layer 302 for the first iteration or the layer 402 for the second iteration) has been formed, a structure that includes the semiconductor substrate structure 309, the existing outmost barrier layer, and the amorphous silicon layer may be placed inside a/the reaction chamber. A process analogous to the process performed for forming the substrate-connecting barrier layer 301 may be performed to form the overlying barrier layer. A material of the substrate-connecting barrier layer 301 may be the same as a material of the overlying barrier layer, e.g., the barrier layer 303 and/or the barrier layer 403.

The amorphous layer(s), e.g., 302 and/or 402, may limit sizes of columnar crystallites of one or more of the barrier layers 301, 303, 401, and 403, such that density (or denseness) of the one or more barrier layers may be enhanced. Therefore, penetration or diffusion of unwanted particles (e.g., boron particles) may be substantially blocked, and interface defects may be minimized or substantially prevented. Advantageously, satisfactory quality of the semiconductor device and other semiconductors manufactured through the same processes may be ensured, and a satisfactory manufacturing yield may be achieved.

In an embodiment, the method may include determining the number of the iterations based on a predetermined target height of the gate-connecting barrier layer (e.g., 303 or 403) with respect to the semiconductor substrate structure 309. The predetermined target height of the gate-connecting barrier layer may represent (or equal) a predetermined thickness of the composite barrier layer according to design specifications. The predetermined thickness may be in a range of 20 angstroms to 30 angstroms in an embodiment.

In an embodiment, the method may include the following steps: monitoring a height of the overlying barrier layer with respect to the semiconductor substrate structure 309 (for each iteration or for each of later iterations); and designating the overlying barrier layer as the gate-connecting barrier layer if the height of the overlying layer reaches a predetermined value. The predetermined value may represent (or equal) the value of a predetermined thickness of the composite barrier layer according to design specifications. The predetermined thickness may be in a range of 20 angstroms to 30 angstroms in an embodiment.

In an embodiment, a thickness of the substrate-connecting barrier layer 301 in a direction (e.g., perpendicular to the bottom surface of the semiconductor substrate structure 309) may be unequal to a thickness of the gate-connecting barrier layer (e.g., 303 or 403) in the direction.

In an embodiment, a first silicon-containing compound set may be applied to the substrate-connecting barrier layer 301 to form the amorphous silicon layer 302. Subsequently, the overlying barrier layer 401 may be formed on the amorphous silicon layer 302. Subsequently, a silicon-containing compound set may be applied to the overlying barrier layer 401 to form the amorphous silicon layer 401. The amorphous silicon layer 402 may be positioned between the amorphous silicon layer 302 and the gate-connecting barrier layer 403 after the gate-connecting barrier layer 403 has been formed.

In an embodiment, a thickness of the substrate-connecting barrier layer 301 in a direction (e.g., perpendicular to the bottom surface of the semiconductor substrate structure) may be unequal to a thickness of the overlying barrier layer 401 in the direction.

In an embodiment, a thickness of the overlying barrier layer 401 in the direction may be unequal to a thickness of the gate-connecting barrier layer 403 in the direction.

In an embodiment, the first silicon-containing compound set may include a first silicon-containing compound, the second silicon-containing compound set may include a second silicon-containing compound, and a molecular formula of the second silicon-containing compound may be different from a molecular formula of the first silicon-containing compound.

In an embodiment, the first silicon-containing compound set may be applied to the substrate-connecting barrier layer 301 for a first time length to form the amorphous silicon layer 302, the second silicon-containing compound set may be applied to the overlying barrier layer 401 for a second time length to form the amorphous silicon layer 402, and the second time length may be unequal to the first time length.

Referring to FIG. 2, FIG. 3, and FIG. 4, the method may further include a step 204 (subsequent to the step 203), providing a conductive gate layer (which may include the layer 304 and/or the layer 305) on the gate-connecting barrier layer (e.g., 303 or 403). The conductive gate electrode layer may be formed of a metal material, such as tungsten (W), and may be formed through one or more of an atomic layer deposition (ALD) process and a chemical vapor deposition (CVD) process.

In an embodiment, for forming the conductive gate layer, a structure that includes the semiconductor substrate structure 309 and the composite barrier layer (e.g., including layers 301, 302, and 303 or including layers 301, 302, 401, 402, and 403) may be placed inside a/the reaction chamber. Subsequently, a borane ($B_2H_6$) source gas and a tungsten hexafluoride ($WF_6$) may be intermittently and/or alternately provided into the reaction chamber, such that a nucleation layer 304 of metal W may be formed on the gate-connecting barrier layer (e.g., 303 or 403) through an ALD process. The nucleation layer 304 may include a plurality of single atomic layers and may have a thickness in a range of 10 angstroms to 1000 angstroms. The ALD process may be performed at a temperature in a range of 250 degrees Celsius to 350 Celsius.

Subsequently, $H_2$ and $WF_6$ may be continuously provided into the reaction chamber, such that the gate body layer 305 of metal W may be formed on the nucleation layer 304 through a CVD process. The CVD process may be performed at a temperature in a range of 300 Celsius to 450 Celsius. Given the high density (or denseness) of the barrier layers, boron (B) particles produced in the CVD process may be substantially blocked from penetrating (or diffusing) into the barrier layers. Therefore, interface defects may be minimized or substantially prevented. Advantageously, satisfactory quality of the semiconductor device and other semiconductor devices manufactured through the same processes may be ensured, and a satisfactory manufacturing yield may be achieved.

Referring to FIG. 3 and FIG. 4, the manufactured semiconductor device may include the following elements: the semiconductor substrate structure 309; the conductive gate layer, which may include the layers 304 and 305 and may overlap the semiconductor substrate structure 309; the substrate-connecting barrier layer 301, which may be positioned between the semiconductor substrate structure 309 and the conductive gate layer; the gate-connecting barrier layer 303 or 403, which may be positioned between the substrate-connecting barrier layer 301 and the conductive gate layer; and the amorphous silicon layer 302, which may be positioned between the substrate-connecting barrier layer 301 and the gate-connecting barrier layer 303 or 403.

Figure 5:
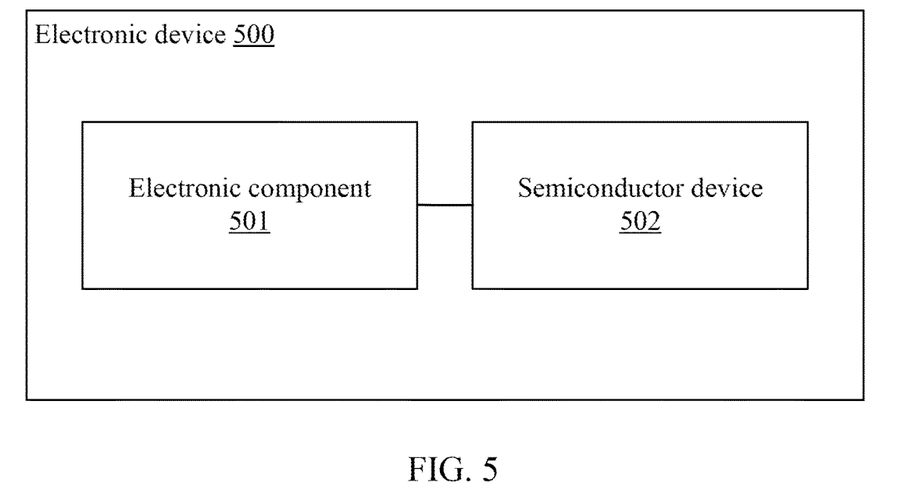
FIG. 5 shows a schematic block diagram that illustrates elements of an electronic device in accordance with one or more embodiments of the present invention.

Referring to FIG. 5, the semiconductor device may further include the following elements: the intermediate barrier layer 401, which may be positioned between the amorphous silicon layer 302 and the gate-connecting barrier layer 403; and the amorphous silicon layer 402, which may be positioned between the intermediate barrier layer 401 and the gate-connecting barrier layer 402.

The semiconductor device may have one or more of the above-discussed features and advantages.

FIG. 5 shows a schematic block diagram that illustrates elements of an electronic device 500 in accordance with one or more embodiments of the present invention. The electronic device 500 may include an electronic component 501 and a semiconductor device 502 that is electrically connected to the electronic component 501. The semiconductor device 502 may have one or more elements, structures, features, and/or advantages discussed with reference to one or more of FIG. 1, FIG. 2, FIG. 3, and FIG. 4.

In an embodiment, the electronic device 500 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 500 may be or may include an intermediate product (e.g., a mobile phone main board) or module that may have one or more of the features and advantages discussed above.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   providing a semiconductor substrate structure;
   providing a substrate-connecting barrier layer on the semiconductor substrate structure;
   performing one or more iterations of a composite-layer formation process to provide a gate-connecting barrier layer, wherein the composite-layer formation process comprises: applying a silicon-containing compound set to an outmost existing barrier layer to form an amorphous silicon layer, and forming an overlying barrier layer on the amorphous silicon layer, wherein the substrate-connecting barrier layer is the outmost existing barrier layer for a first iteration of the one or more iterations, and wherein the gate-connecting barrier layer is the overlying barrier layer resulted from a last iteration of the one or more iterations; and
   providing a conductive gate layer on the gate-connecting barrier layer, wherein a first silicon-containing compound set is applied to the substrate-connecting barrier layer to form a first amorphous silicon layer, wherein a first overlying barrier layer is formed on the first amorphous silicon layer, wherein a second silicon-containing compound set is applied to the first overlying barrier layer to form a second amorphous silicon layer, and wherein the second amorphous silicon layer is positioned between the first amorphous silicon layer and the gate-connecting barrier layer after the gate-connecting barrier layer has been formed.

2. The method of claim 1, wherein a material of the substrate-connecting barrier layer is same as a material of the gate-connecting barrier layer.

3. The method of claim 1, wherein the silicon-containing compound set includes a silicon hydride.

4. The method of claim 1, wherein the silicon-containing compound set includes silane.

5. The method of claim 1, wherein the composite-layer formation process is performed only once to obtain the gate-connecting barrier layer.

6. The method of claim 1 wherein at least two iterations of the composite-layer formation process are performed to obtain the gate-connecting barrier layer.

7. The method of claim 1, further comprising: determining a number of the iterations based on a predetermined target height of the gate-connecting barrier layer.

8. The method of claim 1, further comprising:
   monitoring a height of the overlying barrier layer; and
   designating the overlying barrier layer as the gate-connecting barrier layer if the height of the overlying layer reaches a predetermined value.

9. The method of claim 1, wherein a thickness of the substrate-connecting barrier layer is greater than or equal to a half of a target height of the gate-connecting barrier layer with respect to the semiconductor substrate structure.

10. The method of claim 1, wherein the silicon-containing compound set is applied to the outmost existing barrier layer for a time length in a range of 5 seconds to 60 seconds for each of the one or more iterations.

11. The method of claim 1, wherein a thickness of the substrate-connecting barrier layer in a direction is unequal to a thickness of the gate-connecting barrier layer in the direction.

12. The method of claim 1, wherein a thickness of the substrate-connecting barrier layer in a direction is unequal to a thickness of the first overlying barrier layer in the direction.

13. The method of claim 1, wherein a thickness of the first overlying barrier layer in a direction is unequal to a thickness of the gate-connecting barrier layer in the direction.

14. A method for manufacturing a semiconductor device, the method comprising:
providing a semiconductor substrate structure;
providing a substrate-connecting barrier layer on the semiconductor substrate structure;
performing one or more iterations of a composite-layer formation process to provide a gate-connecting barrier layer, wherein the composite-layer formation process comprises: applying a silicon-containing compound set to an outmost existing barrier layer to form an amorphous silicon layer, and forming an overlying barrier layer on the amorphous silicon layer, wherein the substrate-connecting barrier layer is the outmost existing barrier layer for a first iteration of the one or more iterations, and wherein the gate-connecting barrier layer is the overlying barrier layer resulted from a last iteration of the one or more iterations; and
providing a conductive gate layer on the gate-connecting barrier layer, wherein a first silicon-containing compound set is applied to the substrate-connecting barrier layer for a first time length to form a first amorphous silicon layer, wherein a first overlying barrier layer is formed on the first amorphous silicon layer, wherein a second silicon-containing compound set is applied to the first overlying barrier layer for a second time length to form a second amorphous silicon layer, and wherein the second time length is unequal to the first time length.

15. A method for manufacturing a semiconductor device, the method comprising:
providing a semiconductor substrate structure;
providing a substrate-connecting barrier layer on the semiconductor substrate structure;
performing one or more iterations of a composite-layer formation process to provide a gate-connecting barrier layer, wherein the composite-layer formation process comprises: applying a silicon-containing compound set to an outmost existing barrier layer to form an amorphous silicon layer, and forming an overlying barrier layer on the amorphous silicon layer, wherein the substrate-connecting barrier layer is the outmost existing barrier layer for a first iteration of the one or more iterations, and wherein the gate-connecting barrier layer is the overlying barrier layer resulted from a last iteration of the one or more iterations; and
providing a conductive gate layer on the gate-connecting barrier layer, wherein a first silicon-containing compound set is applied to the substrate-connecting barrier layer to form a first amorphous silicon layer, wherein a first overlying barrier layer is formed on the first amorphous silicon layer, wherein a second silicon-containing compound set is applied to the first overlying barrier layer to form a second amorphous silicon layer, wherein the first silicon-containing compound set includes a first silicon-containing compound, wherein the second silicon-containing compound set includes a second silicon-containing compound, and wherein a molecular formula of the second silicon-containing compound is different from a molecular formula of the first silicon-containing compound.

* * * * *